(12) United States Patent
Nakamura

(10) Patent No.: US 7,091,716 B2
(45) Date of Patent: Aug. 15, 2006

(54) MULTILAYER WIRING BOARD, MANUFACTURING METHOD THEREFOR AND TEST APPARATUS THEREOF

(75) Inventor: Naoki Nakamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 60 days.

(21) Appl. No.: 10/664,930

(22) Filed: Sep. 22, 2003

(65) Prior Publication Data

US 2004/0066634 A1 Apr. 8, 2004

Related U.S. Application Data

(62) Division of application No. 10/274,125, filed on Oct. 21, 2002, now abandoned.

(30) Foreign Application Priority Data

Feb. 25, 2002 (JP) .............................. 2002-047979

(51) Int. Cl.
*G01R 31/26* (2006.01)
(52) U.S. Cl. .................................... 324/158.1; 324/754
(58) Field of Classification Search ............... 324/761, 324/754, 758, 158.1, 765, 755, 73.1, 757, 324/72.5; 257/679, 712, 713; 361/686
See application file for complete search history.

(56) References Cited

U.S. PATENT DOCUMENTS

| | | | | |
|---|---|---|---|---|
| 3,917,984 A | * | 11/1975 | Kong et al. ................. | 361/767 |
| 4,803,115 A | | 2/1989 | Fushiki et al. .............. | 442/234 |
| 4,891,789 A | * | 1/1990 | Quattrini et al. ............. | 365/63 |
| 5,407,557 A | * | 4/1995 | Iida et al. ................... | 205/125 |
| 5,821,614 A | * | 10/1998 | Hashimoto et al. ......... | 257/679 |
| 6,021,050 A | | 2/2000 | Ehman et al. .............. | 361/793 |
| 6,038,133 A | | 3/2000 | Nakatani | |
| 6,215,321 B1 | * | 4/2001 | Nakata ....................... | 324/754 |
| 6,338,767 B1 | | 1/2002 | Nakatani | |
| 6,370,013 B1 | | 4/2002 | Lino | |
| 6,414,504 B1 | * | 7/2002 | Johnston ..................... | 324/761 |
| 6,429,673 B1 | * | 8/2002 | Obata et al. ................ | 324/761 |
| 6,452,410 B1 | * | 9/2002 | Parker ........................ | 324/762 |
| 6,469,374 B1 | | 10/2002 | Imoto ......................... | 257/686 |
| 6,524,717 B1 | | 2/2003 | Takano et al. .............. | 428/450 |
| 6,552,265 B1 | | 4/2003 | Bergstedt et al. .......... | 174/52.4 |
| 6,625,307 B1 | | 9/2003 | Kanungo | |
| 2002/0175402 A1 | | 11/2002 | McCormack et al. ....... | 257/700 |
| 2003/0055970 A1 | | 3/2003 | Kourtidis | |
| 2004/0088416 A1 | | 5/2004 | Nakatani et al. | |

FOREIGN PATENT DOCUMENTS

| | | |
|---|---|---|
| JP | 404122641 A | 4/1992 |
| JP | 408118543 A | 5/1996 |
| JP | 10119195 A | 5/1998 |
| JP | 11-220262 | 8/1999 |
| JP | 2000117733 | 4/2000 |
| JP | 2000216512 | 8/2000 |
| JP | 2001-44641 | 2/2001 |

(Continued)

*Primary Examiner*—Jermele Hollington
*Assistant Examiner*—Jimmy Nguyen
(74) *Attorney, Agent, or Firm*—Westerman, Hattori, Daniels & Adrian, LLP.

(57) ABSTRACT

A built-in component type multilayer wiring board includes at least one resin layer and at least one frame resin layer. The resin layer includes electronic components buried therein. The frame resin layer includes at least one of glass cloth, filler and nonwoven fabric. The frame resin layer includes no electronic component.

5 Claims, 6 Drawing Sheets

FOREIGN PATENT DOCUMENTS

| | | |
|---|---|---|
| JP | 2001-053413 | 2/2001 |
| JP | 2001-119147 | 4/2001 |
| JP | 2001-210955 | 8/2001 |
| JP | 2001-244368 | 9/2001 |

* cited by examiner

MULTILAYER WIRING BOARD, MANUFACTURING METHOD THEREFOR AND TEST APPARATUS THEREOF

This application is a DIV of Ser. No. 10/274,125 Oct. 21, 2002 ABN.

BACKGROUND OF THE INVENTION

1. Field of the Invention

The present invention relates to a multilayer wiring board formed by stacking a plurality of boards mounting electronic components such as a coil, a condenser and an IC chip.

2. Description of the Related Art

It is possible for a multilayer wiring board having electronic components within its layers (referred to as "built-in component type multilayer wiring board", hereinafter) to correspond to speeding up of a signal since distances between the components can be reduced. The built-in component type multilayer wiring board can mount the same components as those of a conventional single layer board using an area smaller than that required by the conventional single layer board. Such a built-in component type multilayer wiring board is useful as a printed wiring board unit. Thus, many examinations of the built-in component type multilayer wiring board have been conducted by manufacturers. However, the manufacturing process of the built-in component type multilayer wiring board is complex. Accordingly, it is difficult to obtain a built-in component type multilayer wiring board of high reliability.

The conventional popular built-in component type multilayer wiring board mounts components on a base board having rigidity. Additionally, the multilayer structure is realized by using a resin sheet of such as a prepreg material including glass cloth, for example, and by making the resin sheet form around and bury mounted electronic components.

A description will be given of the conventional built-in component type multilayer wiring board, with reference to FIGS. 1 and 2. FIG. 1 shows a multilayer wiring board 100. In the multilayer wiring board 100, electronic components are mounted on a base board 101 having rigidity, and the base boards 101 are stacked by hollowing out prepreg material corresponding to areas where the electronic components are mounted.

The base board 101 of the multilayer wiring board 100 is formed by completely cured resin including glass cloth and has a preachieved rigidity. On the other hand, generally, the prepreg material is a resin sheet made by mixing glass cloth and adhesive resin, and in a semi-cured state (referred to as "B stage" in this industry). The glass cloth included in the prepreg material interferes with (occupies space for) the electronic component. Thus, a part of the prepreg material is hollowed out so as to secure space for the mounted electronic components. The multilayer wiring board 100 as shown in FIG. 1 is formed by appropriately stacking such base boards 101 and prepreg material, and performing a complete curing process on the prepreg material.

Accordingly, the conventional multilayer wiring board 100 is formed by stacking the base boards 101 each having high rigidity and prepreg layers 102 formed by performing the complete curing process on the prepreg material. A component 105 is arranged on a wiring pattern 103 in a space 104 within the prepreg layer 102. Further, a reference-numeral 107 denotes a contact hole penetrating the layers. Inside the contact hole 107, wiring 109 made of copper or the like is formed.

FIG. 2 shows another conventional built-in component type multilayer wiring board 110. In FIG. 2, those parts that are the same as those corresponding parts in FIG. 1 are designated by the same reference numerals, and a description thereof will be omitted. The multilayer wiring board 110 is manufactured in the same way as the multilayer wiring board 100 shown in FIG. 1 and has a structure similar to that of the multilayer wiring board 100. However, filling resin 111 for reinforcement is filled in a space 104 of a prepreg layer 102. Accordingly, the multilayer wiring board 110 requires more manufacturing processes than the multilayer wiring board 100. However, the multilayer wiring board 110 has higher reliability than the multilayer wiring board 100 shown in FIG. 1.

However, as mentioned above, the conventional multilayer wiring boards shown in FIGS. 1 and 2 are formed by stacking the base boards 101 and prepreg layers 102 after manufacturing processes of hollowing out the parts of the prepreg material corresponding to the mounted components. Thus, the number of manufacturing processes increases since additional operations such as hollowing out the prepreg material, positioning the mounted components in the space formed in the prepreg material and the like are required. Further, the operation of positioning the holes in the prepreg material is an operation requiring particular accuracy.

Additionally, the multilayer wiring boards 100 and 110 shown in FIGS. 1 and 2, respectively, are manufactured by a single press process after preparing a plurality of base boards 101 and the prepreg layers 102. Therefore, tests of these multilayer wiring boards are mainly local tests performed on each component before stacking and evaluation tests of finished multilayer wiring boards. Therefore, it is not possible to perform adequate electrical testing.

Additionally, when the finished multilayer wiring board includes a defect, it is difficult to fix the defect. Further, the defective rate increases drastically since the multilayer wiring board includes many layers and components. As a result, the manufacturing cost increases.

SUMMARY OF THE INVENTION

A first object of the present invention is to provide a built-in component type multilayer wiring board that can be manufactured by simplified manufacturing processes and a manufacturing method thereof.

A second object of the present invention is to provide an optimum test apparatus for the multilayer wiring board.

In order to achieve the first object, according to one aspect of the present invention, there is provided a multilayer wiring board, including: at least one resin layer including electronic components buried therein; and at least one frame resin layer including at least one of glass cloth, filler and nonwoven fabric, the frame resin layer including no electronic components therein.

Additionally, according to another aspect of the present invention, in the above-mentioned multilayer wiring board, the resin layer may include at least one of filler and nonwoven fabric.

Additionally, according to another aspect of the present invention, in the above-mentioned multilayer wiring board, the frame resin layer may include glass cloth as a frame and a resin surrounding the glass cloth may be completely cured.

Additionally, according to another aspect of the present invention, in the above-mentioned multilayer wiring board, the resin layer may be completely cured with fragments of one of filler and nonwoven fabric included in a resin; and the frame resin layer may be completely cured with fragments of at least one of glass cloth, filler and nonwoven fabric included in a resin.

According to the above-mentioned aspects of the present invention, the frame resin layer having a preachieved rigidity maintains the form of the multilayer wiring board, and the electronic components are buried in the resin layer. Thus, the multilayer wiring board according to the present invention can be manufactured without processes such as hollowing out prepreg material and adjusting the position of a hollowed out part (space) as in the conventional case. Therefore, it is possible to simplify the processes and to manufacture the multilayer wiring board with a low cost.

Additionally, in order to achieve the first object, according to another aspect of the present invention, there is provided a manufacturing method of a multilayer wiring board, including: a first step of mounting an electronic component on a frame resin layer including at least one of glass cloth, filler and nonwoven fabric, the frame resin layer including no electronic component therein; and a second step of forming a resin layer by placing a semi-cured resin sheet on the frame resin layer so as to contact the mounted electronic component, and completely curing the semi-cured resin sheet with the electronic component buried therein.

Additionally, according to another aspect of the present invention, in the above-mentioned manufacturing method, the semi-cured resin sheet may include fragments of at least one of filler and nonwoven fabric.

According to the above-mentioned aspects of the present invention, it is possible to manufacture the multilayer wiring board including the frame resin layer having a preachieved rigidity and maintaining the form of the multilayer wiring board and the resin layer including the electronic components buried therein without including processes such as hollowing out the material and adjusting the position of the space. Thus, according to the manufacturing method of the multilayer wiring board according to the present invention, it is possible to simplify the processes and to manufacture the multilayer wiring board at a low cost compared with the conventional method.

Additionally, in order to achieve the second object, according to another aspect of the present invention, there is provided a test apparatus used for evaluating a multilayer wiring board formed by successively stacking layers, including: a probe part configured to be connected to an incomplete multilayer wiring board that is in a half finished state before completion; and a supplementary part supplementing an element of the complete multilayer wiring board, the incomplete multilayer wiring board lacking the element.

Additionally, according to another aspect of the present invention, in the above-mentioned test apparatus, the supplementary part may include layer wiring of the complete multilayer wiring board, the incomplete multilayer wiring board lacking the layer wiring.

According to the above-mentioned aspects of the present invention, it is possible to perform an evaluation test suitable for the complete multilayer wiring board on the incomplete multilayer wiring board. Thus, it is possible to manufacture the complete multilayer wiring board while checking the operations and functions of circuits when the multilayer wiring board includes such as an IC chip as the electronic component.

Additionally, according to another aspect of the present invention, there is provided a manufacturing method of a multilayer wiring board, wherein: the multilayer wiring board is manufactured while successively testing an incomplete multilayer wiring board using a test apparatus used (designed) for evaluating the multilayer wiring board; and the test apparatus including: a probe part configured to be connected to the incomplete multilayer wiring board in a half finished state before completion; and a supplementary part supplementing an element of a complete multilayer wiring board, the incomplete multilayer wiring board lacking the element.

Additionally, according to another aspect of the present invention, in the above-mentioned manufacturing method, the supplementary part may include layer wiring of the complete multilayer wiring board, the incomplete multilayer wiring board lacking the layer wiring.

According to the above-mentioned aspects of the present invention, a test on the incomplete multilayer wiring board may be also performed in addition to a local test on each component and a test on the complete multilayer wiring board. Thus, it is possible to improve the yield of the complete multilayer wiring board and to lower the manufacturing cost thereof.

Other objects, features and advantages of the present invention will become more apparent from the following detailed description when read in conjunction with the following drawings.

DETAILED DESCRIPTION OF THE PREFERRED EMBODIMENTS

Figure 1:
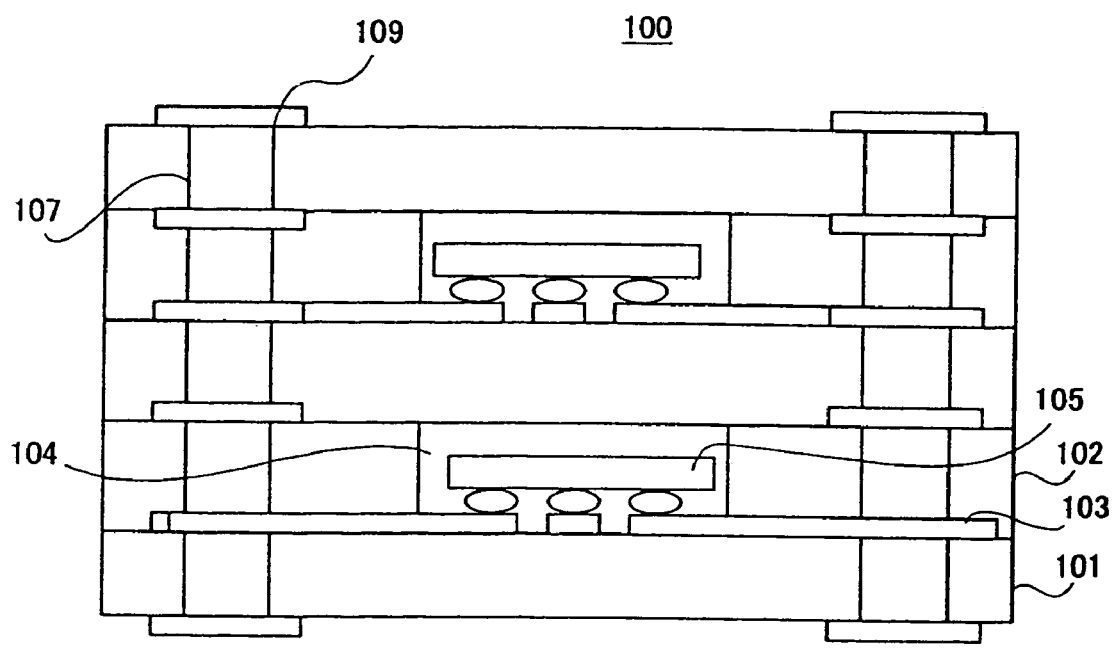
FIG. 1 is a schematic diagram showing a conventional built-in component type multilayer wiring board.
Figure 2:
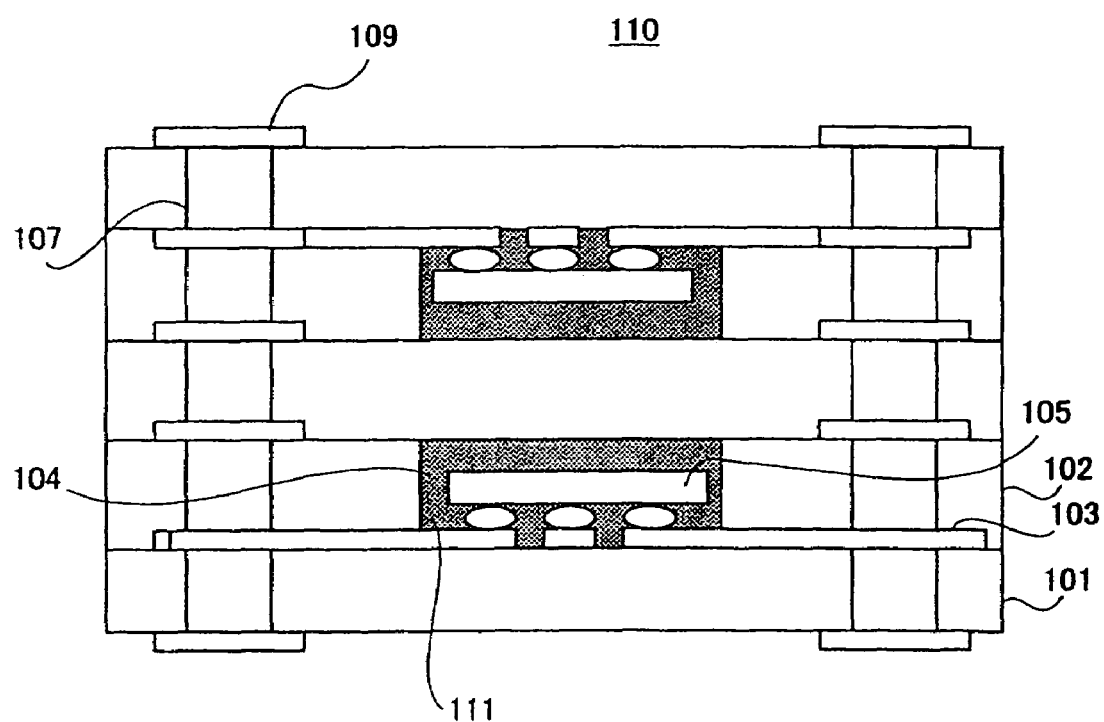
FIG. 2 is a schematic diagram showing another conventional built-in component type multilayer wiring board.
Figure 3:
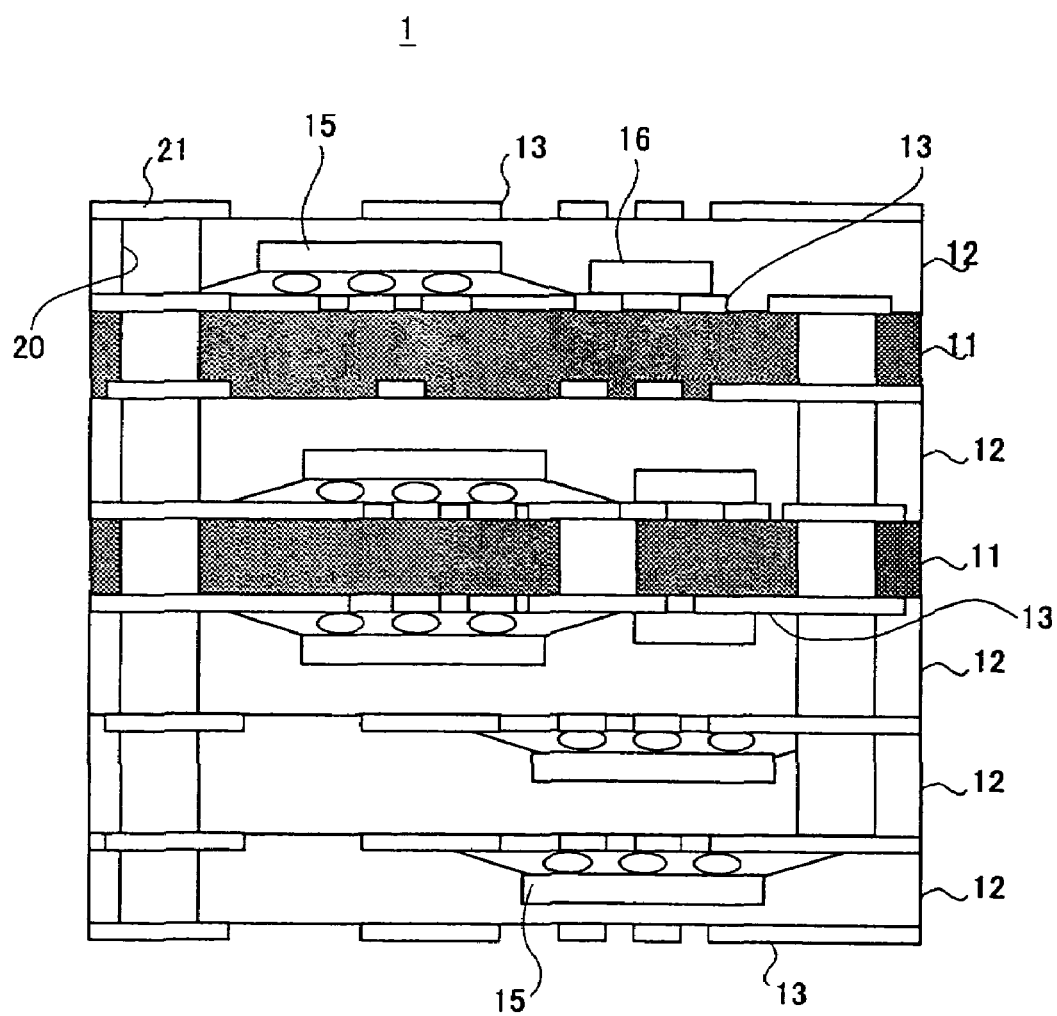
FIG. 3 is a schematic diagram showing the general structure of a built-in component type multilayer wiring board according to an embodiment of the present invention.

A description will be given of embodiments of the present invention, by referring to the drawings. FIG. 3 is a schematic diagram showing a general structure of a built-in electronic component type multilayer wiring board 1 according to an embodiment of the present invention.

In FIG. 3, a frame resin layer 11 corresponds to a conventional base board. The frame resin layer 11 has rigidity to maintain the form of the multilayer wiring board 1. The frame resin layer 11 is a completely cured resin layer including at least one of glass cloth, filler, and nonwoven fabric, for example.

More specifically, the frame resin layer 11 is completely cured including glass cloth as its frame and resin surrounding the glass cloth. Additionally, fragments of filler or nonwoven fabric may be further included in the resin. Further, the frame resin layer 11 may not include glass cloth but include fragments of filler or nonwoven fabric. The frame resin layer 11 may have the desired rigidity and does not include electronic components.

A wiring pattern 13 is formed on one side or both sides of the frame resin layer 11. Active electronic components such as an IC chip 15 and passive electronic components such as a coil and a condenser are connected at predetermined positions.

The reference numeral 12 denotes a resin layer having built-in components (referred to as "resin layer 12", hereinafter). The resin layer 12 includes electronic components 15 and 16 such that the electronic components 15 and 16 are buried therein. The electronic components 15 and 16 are buried in the resin layer 12 during the manufacturing processes. The manufacturing processes thereof will be described later. The multilayer wiring board 1 according to this embodiment is manufactured by sequentially stacking the frame resin layers 11 and the resin layers 12 by the build-up method. When manufacturing the multilayer wiring board 1 by the build-up method, as shown in FIG. 3, the wiring pattern 13 may also be formed on a surface of the resin layer 12 the same as the frame resin layer 11, and the electronic component 15 may be connected to the wiring pattern 13 thereof. That is, as shown in FIG. 3, two or more of the resin layers 12 may be stacked successively.

The above-mentioned resin layer 12 includes only resin, or resin and at least one of filler or nonwoven fabric. Since the electronic components 15 and 16 are buried in the resin layer 12, it is not desirable to use glass cloth that would be an obstacle in burying the electronic components 15 and 16. On the other hand, it is preferable for the resin layer 12 to have high rigidity. Accordingly, it is preferable for the resin layer 12 to have improved rigidity by including filler or nonwoven fabric in a distributed manner. When the filler or nonwoven fabric is formed in fragments and distributed in the resin, the filler or nonwoven fabric will not be an obstacle to burying the electronic components 15 and 16. Fragments of filler, silicon or ceramic material may be used, for example. The shapes of the fragments are not limited. In addition, glass fiber may be used for the fragments of nonwoven fabric.

The same applies to filler or nonwoven fabric used for the above-mentioned frame resin layer 11. It should be noted that the filler or nonwoven fabric of the resin layer 12 needs to have the size and the density that will not be an obstacle in burying the electronic components 15 and 16. However, in the case of the frame resin layer 11, there is no such limitation.

The resin used for forming the resin layer 12 is a thermosetting resin sheet. The thermosetting resin sheet is in the B stage, that is a semi-cured state, and is deformed corresponding to the shapes of the electronic components 15 and 16. When the thermosetting resin sheet is heated and pressured by press working, the resin is softened and further deformed so as to correspond to the shapes of the electronic components 15 and 16. Thereafter, the resin is cooled and completely cured. Thus, the resin layer 12 including the electronic components 15 and 16 buried therein is formed.

It should be noted that similar to the conventional multilayer wiring board, in the multilayer wiring board 1, wiring 21 is formed inside contact holes 20, and the wiring patterns 13 between the layers are electrically connected.

Figure 4:
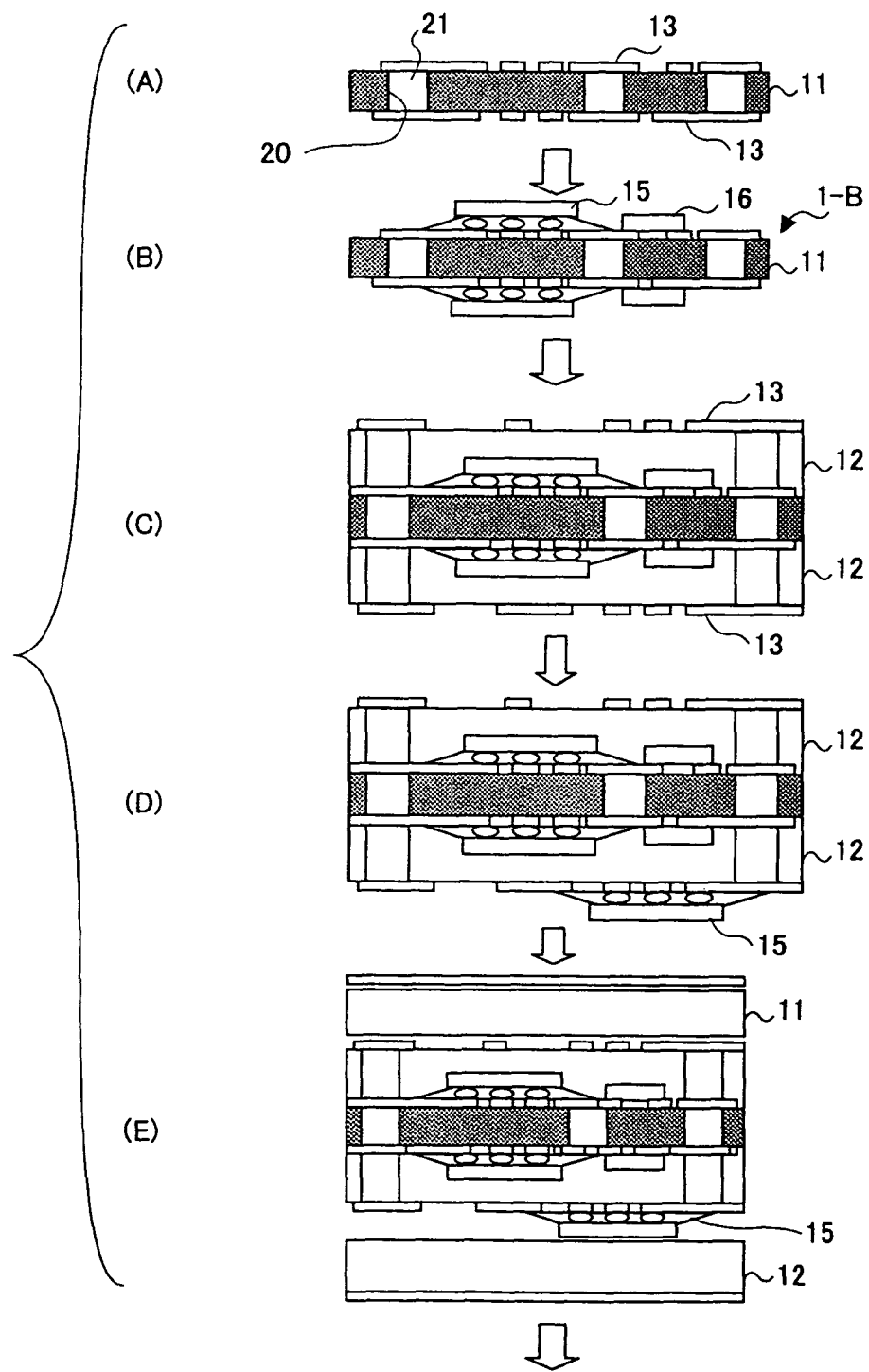
FIG. 4 is a schematic diagram showing the first part of the preferred manufacturing processes of the multilayer wiring board according to the embodiment.
Figure 5:
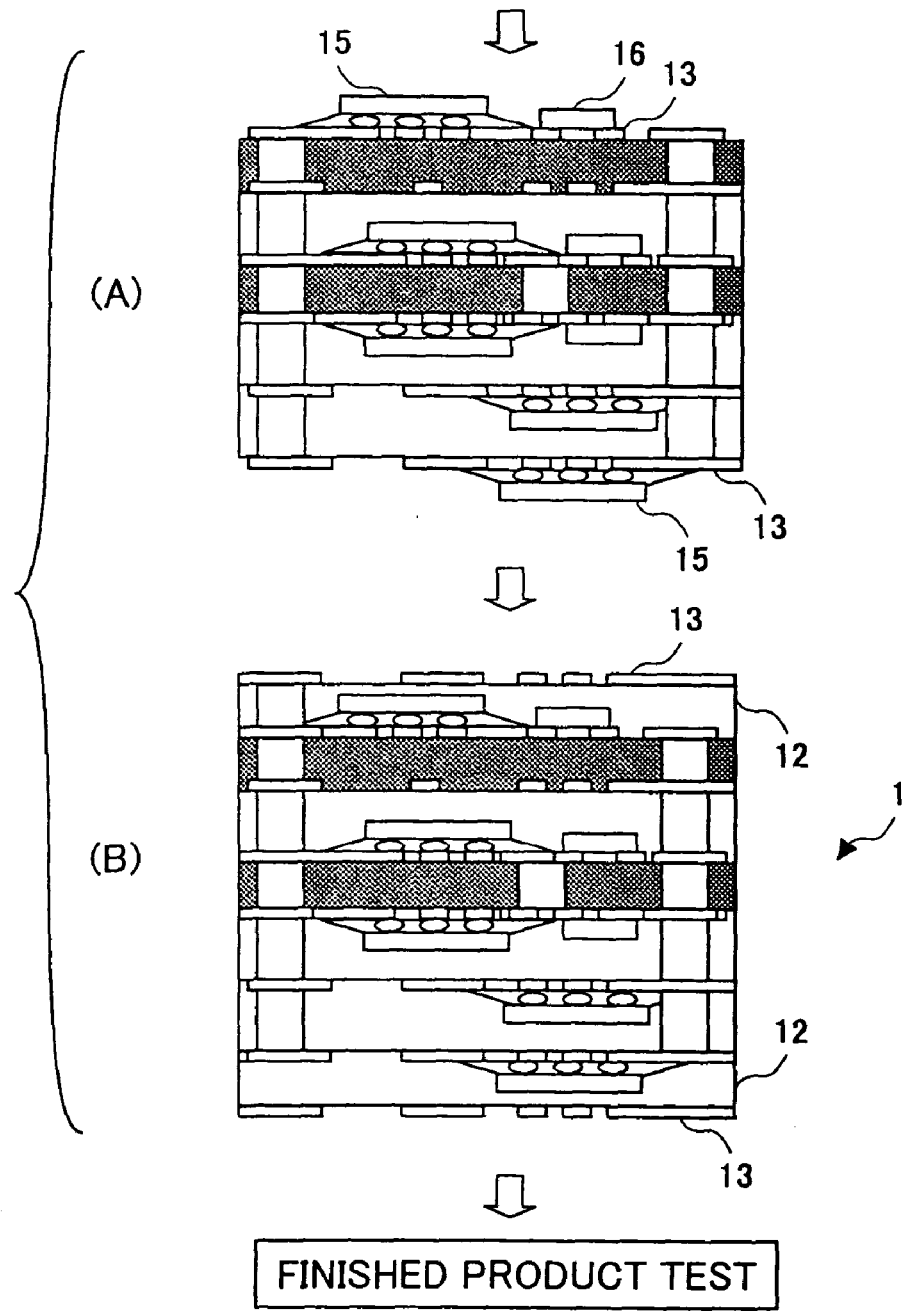
FIG. 5 is a schematic diagram showing the latter part of the preferred manufacturing processes of the multilayer wiring board according to the embodiment.

FIGS. 4 and 5 are schematic diagrams showing preferable manufacturing processes of the above-mentioned multilayer wiring board 1. FIG. 4 shows the first part of the manufacturing processes, and FIG. 5 shows the successive manufacturing processes of the multilayer wiring board 1.

In a process shown in FIG. 4-(A), the wiring pattern 13, the contact hole 20 and the wiring 21 are formed on both sides of the frame resin layer 11 using a conventional exposure/developing technique, plating technique, etching technique and the like.

In the next process, as shown in FIG. 4-(B), the electronic components 15 are mounted on the wiring patterns 13, and thus a first incomplete multilayer wiring board 1-B is formed. An evaluation test is performed on the incomplete multilayer wiring board 1-B using a test apparatus that will be described later. The incomplete multilayer wiring board 1-B that is determined to be defective is fixed or disposed of. Only the normal incomplete multilayer wiring board 1-B is processed in the next process as shown in FIG. 4-(C).

It should be noted that, in the following, a description will be omitted of an evaluation test. However, when the same evaluation test is performed after each of the steps, and only the normal incomplete multilayer wiring board is processed in the next process, it is possible to improve yield of complete multilayer wiring boards. It is not always necessary to perform the evaluation test after every process. The evaluation test may be performed after specific processes.

In the next process, as shown in FIG. 4-(C), a press working of heating and pressuring is performed after placing resin sheets in a B-stage state on both sides of the frame resin layer 11. As mentioned above, the resin sheet has a thermosetting property, and may include filler or nonwoven fabric in fragments. By performing this process, the resin sheet is completely cured and the resin layers 12 including buried electronic components 15 therein are formed on both sides of the incomplete multilayer wiring board 1-B. Thereafter, the wiring patterns 13 are formed on a surface of each of the resin layers 12.

In the next process, as shown in FIG. 4-(D), the electronic component 15 is mounted on the lower side resin layer 12.

Additionally, in the next process, as shown in FIG. 4-(E), the second frame resin layer 11 is mounted on the upper side of the resin layer 12. The resin sheet for forming the resin layer 12 that buries the electronic component 15 mounted in the former step (refer to FIG. 4-(D)) is placed on the lower side resin layer 12. Thereafter, press working of heating and pressuring is performed.

In the next process, as shown in FIG. 5-(A), the electronic components 15 and 16 are further mounted on a surface of the frame resin layer 11. Also, another electronic component 15 is mounted on a surface of the resin layer 12. Then, in the last process, as shown in FIG. 5-(B), resin sheets are placed on both sides as mentioned above so as to bury the electronic components 15 and 16 in the resin layer 12. At last, the complete multilayer wiring board 1 as shown in FIG. 3 is obtained by forming the wiring patterns 13 on both sides.

As described above, it is possible to perform the evaluation test on the incomplete multilayer wiring boards shown in FIG. 4-(C), FIG. 4-(D), FIG. 4-(E) and FIG. 5-(A) as well as the incomplete multilayer wiring board 1-B shown in FIG. 4-(B) so as to improve the yield of the complete multilayer wiring board 1 shown in FIG. 5-(B). A finished product test is performed on the complete multilayer wiring board 1 the same as the conventional multilayer wiring board.

In this embodiment, a case is shown where the multilayer wiring board 1 includes two frame resin layers 11. However, the number of the frame resin layers 11 may be varied in accordance with required intensity.

Figures 6A, 6B:
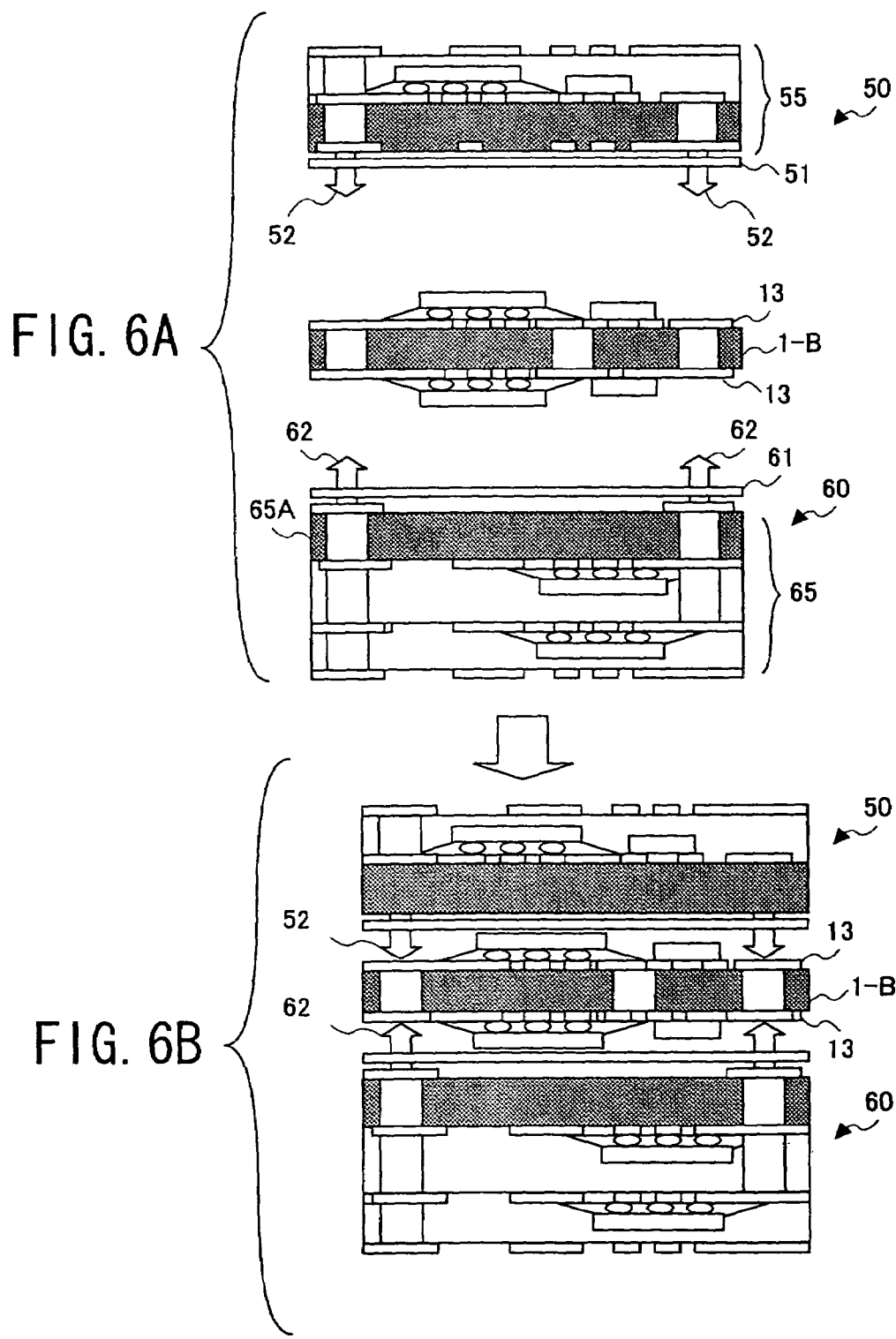
FIGS. 6A and 6B are schematic diagrams showing a test apparatus used in the manufacturing processes of the multilayer wiring board.

FIGS. 6A and 6B are schematic diagrams showing a test apparatus that can be suitably used in the above-mentioned manufacturing processes. In FIGS. 6A and 6B, a case is shown where a test is performed on the incomplete multilayer wiring board 1-B manufactured in the process shown in FIG. 4-(B). Additionally, FIGS. 6A and 6B only show parts characteristic of the test apparatus when compared with a conventional test apparatus, and the other parts are not shown.

The test apparatus includes an upper test jig 50 for contacting the upper surface of the incomplete multilayer wiring board 1-B, and a lower test jig 60 for contacting the lower surface of the incomplete multilayer wiring board 1-B. FIG. 6A shows a state where the incomplete multilayer wiring board 1-B, the upper test jig 50 and the lower test jig 60 are separated from each other. FIG. 6B shows a state where the incomplete multilayer wiring board 1-B contacts the upper test jig 50 and the lower test jig 60.

The upper test jig 50 includes a layer wiring part 55 formed above the incomplete multilayer wiring board 1-B, which layer wiring part 55 is incorporated in the complete multilayer wiring board 1. The upper test jig 50 is provided with probe pins 52 for connecting with the incomplete multilayer wiring board 1-B and a probe board 51 for supporting the probe pins 52.

Similarly, the lower test jig 60 includes a layer wiring part 65 formed below the incomplete multilayer wiring board 1-B. The lower test jig 60 is provided with probe pins 62 and a probe board 61 for supporting the probe pins 62. Basically, the lower test jig 60 should include a resin layer 12 as the top layer of the layer wiring part 65. However, the layer wiring part 65 does not include the frame resin layer 11 that maintains the layer structure. Thus, the layer wiring part 65 includes a reinforcing layer 65A instead of the frame resin layer 11. The reinforcing layer 65A is similar to the frame resin layer 11 and has high rigidity. Basically, the part where the reinforcing layer 65A is formed should be the resin layer 12 that buries the electronic components. However, this is not a problem since, as shown in FIGS. 6A and 6B, the electronic components 15 and 16 on the lower surface of the incomplete multilayer wiring board 1-B are not buried.

As mentioned above, the test is performed by supplementing elements that the incomplete multilayer wiring board 1-B lacks by providing such elements to the jigs 50 and 60 of the test apparatus. Accordingly, it is possible to perform a continuity test. At the same time, it is also possible to check functions of electronic components such as an IC chip.

In the above-mentioned test apparatus, the test is made possible by causing the upper test jig 50 and the lower test jig 60 to include the respective layer wiring (elements). However, the elements lacking may be provided not to the test jigs 50 and 60 but to the test apparatus. Additionally, circuit conditions corresponding to the layer wiring parts may be set in the test apparatus instead of forming the actual layer wiring parts as described above.

The test apparatus as shown in FIGS. 6A and 6B is for the incomplete multilayer wiring board 1-B as shown in FIG. 4-(B). However, the same evaluation test may be performed on the incomplete multilayer wiring boards as shown in FIGS. 4-(C) through 5-(A) when respective jigs are provided.

As described above, only quality products are used in the manufacturing processes while successively performing the tests on the incomplete multilayer wiring boards using the above-mentioned test apparatus. Therefore, it is possible to improve the yield of the complete multilayer wiring board.

Further, it should be noted that the above-mentioned test apparatus may be applied to not only the built-in component type multilayer wiring boards but also general multilayer wiring boards manufactured by the build-up method.

Additionally, in FIG. 3, a case is shown of the multilayer wiring board 1 formed by stacking the frame resin layers 11 and the resin layers 12 by the build-up method. However, the multilayer wiring board according to the present invention may be manufactured by stacking all the layers at one time. In this case, the multilayer wiring board may be manufactured with a single press working by preparing in advance the desired number of frame resin layers 11 mounting the electronic components 15 and 16 as shown in FIG. 4-(B), and inserting the resin layers 12 in between the above-mentioned frame resin layers 11 based on a stacked layers design. However, in a case of stacking all the layers at one time, the resin sheets that form the resin layers 12 are in a semi-cured state (B stage). Accordingly, it is difficult to realize a form in which the resin layers 12 are stacked successively and the electronic components 15 are included in the resin layers 12, all at the same time.

The present invention is not limited to the specifically disclosed embodiments, and variations and modifications may be made without departing from the scope of the present invention.

The present application is based on Japanese priority application No. 2002-047979 filed on Feb. 25, 2002, the entire contents of which are hereby incorporated by reference.

What is claimed is:

1. A test apparatus used for testing a multilayer wiring board being fabricated by stacking wiring layers successively, said test apparatus comprising:
    a probe that detects defects in the multilayer wiring board under fabrication; and
    an element supplementing unit that mounts additional elements on the multilayer wiring board under fabrication when no defect is detected by the probe, wherein
    the probe tests the multilayer wiring board under fabrication each time an additional element is newly installed; and
    the element supplementing unit mounts a new additional element on the multilayer wiring board under fabrication when the probe does not detect defects.

2. The test apparatus as claimed in claim 1, wherein the additional elements to be mounted are included in the element supplementing unit.

3. The test apparatus as claimed in claim 1, wherein the element supplementing unit includes
    a first section arranged to face a first side of the multilayer wiring board under fabrication to mount the additional elements on the first side; and
    a second section arranged to face a second side of the multilayer wiring board under fabrication to mount the additional elements on the second side.

4. The test apparatus as claimed in claim 1, wherein when a defect is detected by the probe in the multilayer wiring board under fabrication, the element supplementing unit disposes of the multilayer wiring board.

5. The test apparatus as claimed in claim 1, wherein the element supplementing unit comprises a thermosetting resin, and the thermosetting resin in cured when no defect is detected by the probe.

* * * * *